US006433645B1

(12) United States Patent
Mann et al.

(10) Patent No.: US 6,433,645 B1
(45) Date of Patent: *Aug. 13, 2002

(54) PROGRAMMABLE CLOCK GENERATOR

(75) Inventors: Eric N. Mann, Issaquh; John Q. Torode, Hunts Point, both of WA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/048,905

(22) Filed: Mar. 26, 1998

Related U.S. Application Data

(63) Continuation of application No. 08/865,342, filed on May 29, 1997, now Pat. No. 5,877,656, which is a continuation of application No. 08/549,915, filed on Oct. 30, 1995, now Pat. No. 5,684,434.

(51) Int. Cl.[7] ................................................ A03L 7/00

(52) U.S. Cl. ...................... 331/18; 331/74; 331/108 C; 331/2; 331/1 A; 327/147; 327/150; 327/105

(58) Field of Search ............................. 331/1 A, 2, 16, 331/17, 18, 25, 74, 108 C, 108 D; 327/105, 107, 147–150, 156–159; 455/260

(56) References Cited

U.S. PATENT DOCUMENTS

| 4,816,700 A | 3/1989 | Imel ........................... 307/269 |
| 4,882,549 A | 11/1989 | Galani et al. ............. 331/16 X |

(List continued on next page.)

FOREIGN PATENT DOCUMENTS

| JP | 63-287113 | 11/1988 | ............. H03L/7/18 |
| WO | 8906456 | 3/1989 | ........... H03B/19/00 |

OTHER PUBLICATIONS

"An EEPROM for Microprocessors and Custom Logic", By Roger Cuppens et al., IEEE Journal of Solid–State Circuits, vol. SC–20, No. 2, Apr. 1985, pp. 603–608.

"An Experimental 5–V–Only 256–kbit CMOS EEPROM with a High–Performance Single–Polysilicon Cell", By Jun–Ichi Miyamoto et al., IEEE Journal of Solid State Circuits, vol. SC–21, No. 5, Oct. 1986, pp. 852–860.

"A Single Poly EPROM For Custom CMOS Logic Applications", By Reza Kazerounian et al., IEEE 1986 Custom Integrated Circuits Conference, pp. 59–62.

"TI's quantum leap", Electronic Engineering Times, Issue 517, Dec. 19, 1988 pp. 1 and 86.

"An EPROM Cell Structure foe EPLDs Compatible with Single Poly Gate Process", By Kuniyushi Yoshikawa et al., Extended Abstracts of the 18th (1986 International) Conference on Solid State Devices and Materials, Tokyo, 1986, pp. 323–326.

(List continued on next page.)

*Primary Examiner*—Arnold Kinkead
(74) *Attorney, Agent, or Firm*—Christopher P. Maiorana, P.C.

(57) ABSTRACT

A programmable circuit for generating a clock signal is disclosed. The present invention provides a clock generator architecture that combines PLL-based clock generator circuitry with an on-chip EPROM in a monolithic clock generator chip. The clock generator allows for electrical configuration of various information including PLL parameters, input thresholds, output drive levels and output frequencies. The various parameters can be configured after the clock generator is fabricated. The parameters can be configured either during wafer sort or after packaging. The clock generator can be erased prior to packaging so programming can be verified.

35 Claims, 3 Drawing Sheets

U.S. PATENT DOCUMENTS

| | | | |
|---|---|---|---|
| 4,980,653 A | 12/1990 | Shepherd | 331/16 |
| 5,036,216 A * | 7/1991 | Hohmann et al. | 309/269 |
| 5,036,230 A | 7/1991 | Bazes | 307/527 |
| 5,036,300 A * | 7/1991 | Nicolai | 331/143 |
| 5,095,280 A | 3/1992 | Wunner et al. | 328/63 |
| 5,136,180 A | 8/1992 | Caviasca et al. | 307/269 |
| 5,142,247 A | 8/1992 | Lada, Jr. et al. | 331/2 X |
| 5,144,254 A | 9/1992 | Wilke | 331/2 X |
| 5,177,771 A | 1/1993 | Glassburn | 377/39 |
| 5,233,314 A | 8/1993 | McDermott et al. | 331/17 |
| 5,237,699 A | 8/1993 | Little et al. | 395/750 |
| 5,256,994 A | 10/1993 | Langendorf | 331/16 |
| 5,289,138 A | 2/1994 | Wang | 331/2 X |
| 5,307,381 A | 4/1994 | Ahuja | 375/107 |
| 5,336,939 A | 8/1994 | Eitrheim et al. | 307/269 |
| 5,357,204 A | 10/1994 | Knoll | 328/62 |
| 5,359,232 A | 10/1994 | Eitrheim et al. | 307/268 |
| 5,369,311 A | 11/1994 | Wang et al. | 327/292 |
| 5,371,772 A | 12/1994 | Al-Khairi | 377/47 |
| 5,389,826 A | 2/1995 | Sonobe | 307/125 |
| 5,398,262 A | 3/1995 | Ahuja | 375/354 |
| 5,412,349 A | 5/1995 | Young et al. | 331/34 |
| 5,444,405 A | 8/1995 | Truong et al. | 327/239 |
| 5,446,867 A | 8/1995 | Young et al. | 395/550 |
| 5,451,912 A | 9/1995 | Torode | 331/108 |
| 5,481,697 A | 1/1996 | Mathews et al. | 395/550 |
| 5,532,636 A | 7/1996 | Mar et al. | 327/543 |
| 5,535,377 A | 7/1996 | Parks | 395/550 |
| 5,537,068 A | 7/1996 | Konno | 327/115 |
| 5,537,582 A | 7/1996 | Draeger | 395/550 |
| 5,546,563 A | 8/1996 | Chuang | 395/500 |
| 5,550,499 A | 8/1996 | Eitrheim | 327/175 |
| 5,555,025 A | 9/1996 | McArthur | 348/478 |
| 5,563,553 A | 10/1996 | Jackson | 331/57 |
| 5,608,770 A | 3/1997 | Noguchi et al. | 377/47 |
| 5,610,955 A | 3/1997 | Bland | 375/376 |
| 5,614,869 A | 3/1997 | Bland | 331/1 A |
| 5,630,148 A | 5/1997 | Norris | 395/750 |
| 5,638,016 A | 6/1997 | Eitrheim | 327/175 |
| 5,638,542 A | 6/1997 | Nikjou | 395/750 |
| 5,684,418 A | 11/1997 | Yanagiuchi | 327/99 |
| 5,684,434 A * | 11/1997 | Mann et al. | 331/16 |
| 5,687,202 A | 11/1997 | Eitrheim | 375/376 |
| 5,696,949 A | 12/1997 | Young | 395/551 |
| 5,703,537 A | 12/1997 | Bland et al. | 331/1 A |
| 5,703,540 A | 12/1997 | Gazda et al. | 331/16 |

OTHER PUBLICATIONS

"New Memory–Cell Design May Lower EPLD Costs", By Charles L. Cohen, Electronics, Sep. 4, 1986, p. 30.

"A Modulat 1μm CMOS Single Polysilicon EPROM PLD Technology", By P.J. Cacharelis et al., 1988 IEEE, pp. 60–IEDM 88 to 63–IEDM 88.

"A Microprogrammable Processor Using Single Poly EPROM", By Kenneth J. Schultz, 1988, pp. 1–97 (plus appendix).

"SIPPOS (Single Poly Pure CMOS) EEPROM Embedded FPGA by News Ring Interconnection and Highway Path", By Katsuhiko Ohsaki et al., IEEE 1994 Custom Integrated Circuits Conference, pp. 189–192.

"A CMOS Compatible Single Poly EPROM", By David H.K. Hoe, 1988, pp. 1–74 (plus appendix).

"Design, Characterization and Modeling of Single Poly EPROM Cells", By Davie H.K. Hoe et al., p. 85.

"A 9ns, Low Standby Power CMOS PLD with a Single––Poly EPROM Cell", by Scott Frake et al., 1989 IEEE International Solid–State Circuits Conference, Feb. 17, 1989, pp. 230–231 and 346.

"A microprogrammable processor using single poly EPROM", By Kenneth J. Schulz et al., Integration, the VLSI journal 8 (1989) pp. 189–199.

"A Single–Poly CMOS Process Merging Analog Capacitors, Bipolar and EPROM Devices", By T–I Liou et al., 1989 Symposium on VLSI Technology, Digest of Technical Papers, pp. 37–38.

"Cell and Circuit Design for Single–Poly EPROM", By David H.K. Hoe et al., IEEE Journal of Solid–State Circuits, vol. 24, No. 4, Aug. 1989, pp. 1153–1157.

"Trimming Analog Circuits Using Floating–Gate Analog MOS Memory", By L. Richard Carley, IEEE Journal of Solid–State Circuits, vol. 24, No. 6, Dec. 1898, pp. 1569–1575.

"An EPROM Cell Structure for EPLD's Compatible with Single Poly–Si Gate Process", By Kuniyoshi Yoshikawa et al., Toshiba's Selected Papers on Science and Technology, 1991, vol. 3, No. 1 Semiannual, pp. 79–83.

"A Single Poly EEPROM Cell Structure for Use in Standard CMOS Processes", By Katsuhiko Ohsaki et al., IEEE Journal of Solid–State Circuits, vol. 29, No. 3, Mar. 1994, pp. 311–316.

"An ERPOM Cell Structure for EPLD's Compatible with Single Poly–Si Gate Process", IEEE Transactions on Electron Devices, vol. 37, No. 3, Mar. 1990, pp. 675–679.

"A fully modular 1 μm CMOS technology incorporating EEPROM, EPROM and interpoly capacitors", By Philip J. Cacharelis et al., 20th European Solid State Device Research Conference, Nottingham, Sep 1–13, 1990, pp. 547–550.

"A study of the oxide grown on $WSi_2$", By P. Ghezzi et al., Semiconductor Science and Technology, vol. 6, No. 7, Jul. 1991, pp. 684–689.

"A Novel Integration Technology of EEPROM Embedded CMOS Logic VLSI Suitable for ASIC Applications", By Masataka Takebuchi et al., IEEE 1992 Custom Integrated Circuits Conference, pp. 9.6.1–9.6.4.

"Analysis of Writing and Erasing Procedure of Flotox EEPROM Using the New Charge Balance Condition (CBC) Model", By Satoshi Sugino et al., NUPAD IV May 31–Jun. 1, 1992, pp. NUPADIV–65 to NUPADIV–69.

"A Planar Type EEPROM Cell Structure by Standard CMOS Process and Applications", By Katsuhiko Ohsaki et al., pp. 55–56.

"A Planar Type EEPROM Cell Structure by Standard CMOS Process for Integration with Gate Array, Standard Cell, Microprocessor and for Neural Chips", By Katsuhiko Ohsaki et al., IEEE 1993 Custom Integrated Circuits Conference, pp–23.6.1–23.6.4.

"ASICs spread through new system design", By Sam Weber, Electronic Engineering Times, May 10, 1993, pp. 16, 54, and 58.

"Semiconductor Industry & Business Survey—Company Update: American Microsystems, Inc.", Jun. 28, 1993, pp. 8–12.

"High Voltage Circuits in Standard CMOS Processes", By Corey Petersen et al., 1982 IEEE, pp. 287–291.

Sze, S.M., *Physics of Semiconductor Devices*, 2nd Ed., John Wiley & Sons, New York, 1981, pp. 496–506.

Integrated Circuit Systems, Inc.'s Answer and Counterclaims to First Amended Complaint for Patent Infringement, U.S. District Court, District of Delaware, Docket No. C.A. No. 01–199–SLR, May 3, 2001, pp. 1–7.

* cited by examiner

PROGRAMMABLE CLOCK GENERATOR

This application is a continuation of U.S. Ser. No. 08/865,342, filed May 29, 1997, now U.S. Pat. No. 5,877,656, which is a continuation of U.S. Ser. No. 08/549,915, filed Oct. 30, 1995, now U.S. Pat. No. 5,684,434.

FIELD OF THE INVENTION

This invention relates to clock generators generally, and more particularly to a phase-locked-loop frequency synthesizer having post production configuration capabilities contained on an EPROM.

BACKGROUND OF THE INVENTION

It is well. known to construct a clock generator that has a fixed frequency which is determined during the silicon wafer fabrication of the clock generator. The frequency of the clock generator is determined by using a specific pattern during the manufacturing process involved in the wafer production of the clock generator. An important competitive advantage can be obtained by providing a clock generator that can be configured late in the manufacturing process, preferably after wafer fabrication. Phase-locked-loop (PLL) based clock generators typically use read only memory (ROM) tables to store frequency selection and configuration information. This information can be altered by using a device specific mask during wafer fabrication. A disadvantage with this technique is that once the device has been fabricated, the device can no longer be reconfigured.

Another technique used to obtain late configuration for PLL-based clock generators is accomplished by implementing a number of electrically programmable fuses made of aluminum, polysilicon or some other type of material that is appropriate for fuse fabrication. These fuses could then be programmed after production of the clock generator. The fuse technique provides somewhat of a competitive advantage by reducing the number of parts required to be, stored in inventory at any given time. The late programming of the fuses also reduces the time necessary to produce the clock generator. However, this technique suffers from the disadvantage of having limited configuration information that can be stored. As a result, the implementation of new frequency clock generators would require mask programming during fabrication to realize the new frequencies. Some prior art devices do implement more than one frequency table on a single ROM, but are limited to the specific pre-defined frequencies available in the ROM mask. Furthermore, it is not possible to test the fuses without blowing them, which permanently alters the device.

Another technique which could be used to obtain late configurations for clock generators is accomplished by using laser configurable parts which can be programmed using a polysilicon or aluminum link similar to the fuse technique. Also similar to the fuse technique example would be the disadvantage of storing only a limited amount of configuration information. It does not appear that the prior art has proposed a solution to the problem of providing a clock generator that is programmable late in the manufacturing cycle, can store enough configuration information to be commercially practical and can be manufactured at an acceptable cost.

SUMMARY OF THE INVENTION

The present invention provides a clock generator architecture that combines PLL-based clock generator circuitry with an on-chip EPROM in a monolithic clock generator chip. The clock generator allows for electrical configuration of various information including PLL parameters, input thresholds, output drive levels and output frequencies. The various parameters can be configured after the clock generator is fabricated. The parameters can be configured either during wafer sort or after packaging. The clock generator can be erased prior to packaging so programming functionality can be verified. All of these features are accomplished without the use of programming fuses.

Objects, features and advantages of the present invention are to provide a clock generator that uses an on-chip EPROM in a monolithic clock generator chip, can be adapted to various PLL-based clock generators, can be electrically configured, can be erased prior to packaging, reduces cycle time from customer requests to prototypes, and can be field programmed if desired.

BRIEF DESCRIPTION OF THE DRAWINGS

These and other objects, features and advantages of the present invention will be apparent from the following detailed description, the appended claims and the accompanying drawings in which:

DETAILED DESCRIPTION OF THE PREFERRED EMBODIMENT

Figure 1:
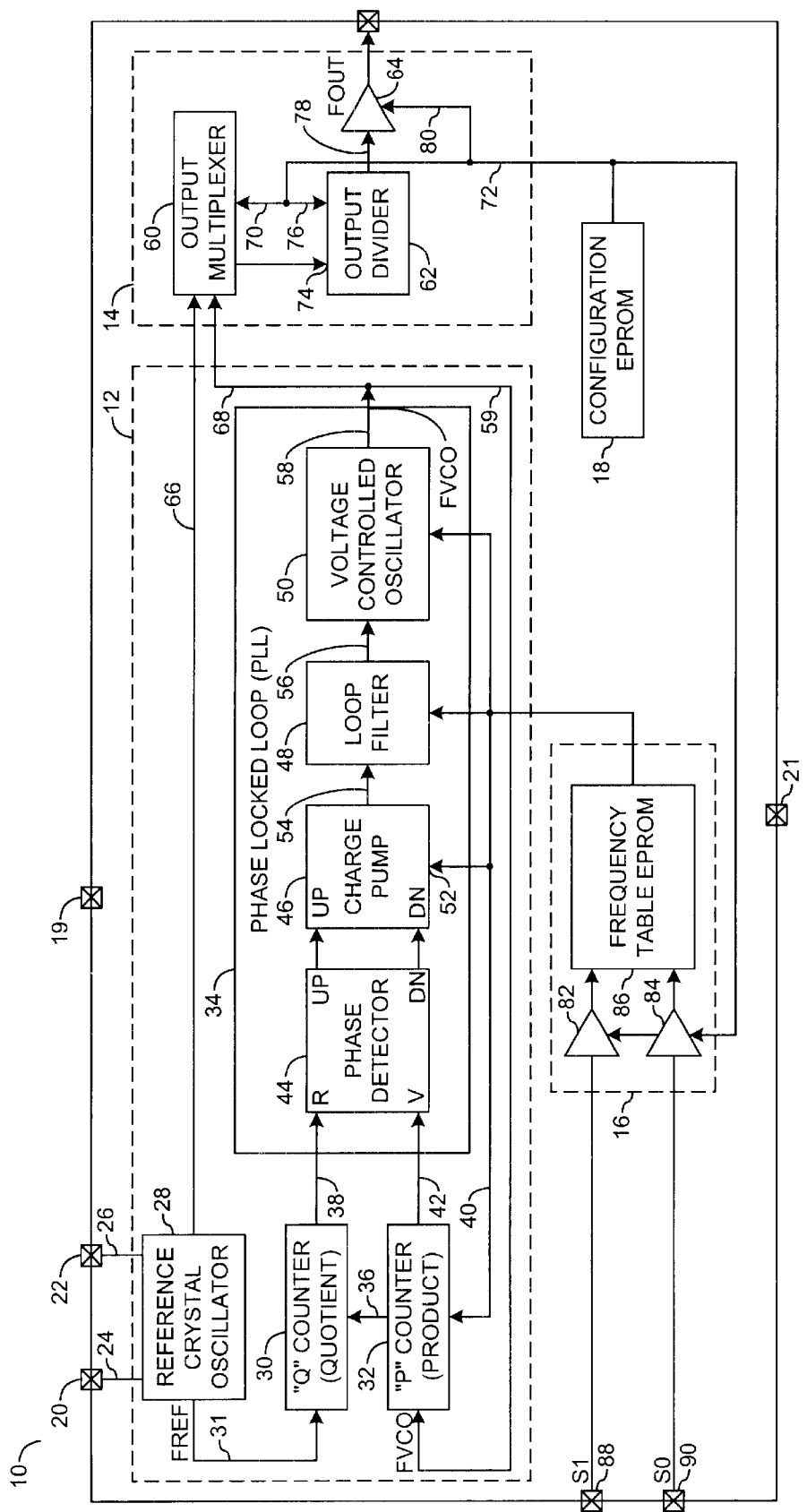
FIG. 1 is a block diagram representing the overall architecture of the clock generator in accordance with a presently preferred embodiment of the invention.

Referring to FIG. 1, a block diagram of the frequency generator 10 is shown in accordance with a presently preferred embodiment of the invention. The frequency generator 10 generally comprises a frequency generation block 12, an output block 14, a frequency control block 16 and a configuration control block 18. The frequency generator 10 receives a first input 19 from an external power source (not shown) and receives a second input 21 from a ground. The frequency generation block 12 receives a first input 20 and a second input 22 from an external crystal (not shown). The external crystal produces a fixed frequency signal at the first and second inputs 20 and 22. A reference crystal oscillator 28 has a first input 24 and a second input 26 that receive the signal from the first and second inputs 20 and 22. The frequency generation block 12 generally comprises a reference crystal oscillator 28, a quotient counter 30, a product counter 32 and a phase-locked-loop (PLL) 34. The reference crystal oscillator 28 provides a reference signal Fref that is received by the quotient counter 30 through an input line 31. The quotient counter 30 also receives an input from a bus line 36. The bus line 36 receives information from the frequency control block 16. Thus, the bus line 36 may be an extension of the bus line 40. The quotient counter 30 provides an output that is presented to the PLL 34 through output line 38. The product counter 32 receives an input Fvco that is received from the PLL 34. The product counter 32 also receives an input from a bus line 40 that is coupled to the frequency control block 16. The product counter 32 provides an output 42 that is coupled to the PLL 34. The quotient counter 30 and the product counter 32 use signals received through the bus line 40 from the frequency control block 16 to provide frequencies at outputs 38 and 42 that are presented to the PLL 34. This allows the output of the PLL 34 to respond to the signals presented on the bus line 40. The flexible nature of the quotient counter 30 and the product counter 32 provide programmable outputs 38 and 42 to the PLL 34. The reference signal Fref and the input Fvco are waveforms of a particular frequency. Conversely, the bus line 36 and the bus line 40 present distinct logic signals.

The phase-locked-loop 34 comprises a phase detector 44, a charge pump 46, a loop filter 48 and a voltage controlled oscillator 50. The phase detector 44 has an input R that receives a signal from output 38 of the quotient counter 30. Similarly, the phase detector 44 has an input V that receives a signal from the output 42 of the product counter 32. The phase detector 44 has a first output Up and a second output Dn. The charge pump 46 has a first input Up that receives the output Up from the phase detector 44. The charge pump has a second input Dn that receives an input from the Dn output of the phase detector 44. The charge pump 44 also has an input 52 that receives frequency configuration information from the frequency control block 16 through the bus line 40. The charge pump 46 sends an output signal on output line 54 that is received by the loop filter 48. Additionally, the loop filter 48 receives control information from the frequency control block 16 through the bus line 40. The loop filter 48 provides a signal on output line 56 that is received by the voltage controlled oscillator 50. The voltage controlled oscillator 50 provides a signal on line 58 that is received by the output block 14 and is also used in a feedback path 59 to provide the input Fvco to the product counter 32. The voltage controlled oscillator 50 also receives control information from the frequency control bus 40.

The phase detector 44, the charge pump 46, the loop filter 48 and the voltage controlled oscillator 50 are internal components of the PLL 34 and are used to control the frequency of the output 58. When operating in the closed loop or locked condition, the phase and frequency of the V and R inputs of the phase detector 44 may be equal. When these conditions are met, the output frequency 58 of the phase locked loop 34 is equal to Fref 31 divided by the quotient counter 30 multiplied by the product counter.

The output block 14 generally comprises an output multiplexer 60, an output divider 62 and a buffer 64. The output multiplexer 60 receives a first input signal 66 from the reference crystal oscillator 28 and a second input signal 68 from the feedback path 59. The output multiplexer 60 also receives a control input 70 from a bus line 72 that is connected to the configuration block 18. The output divider 62 receives an input 74 from the PLL 34 that represents the voltage controlled oscillator frequency Fvco. The output divider 62 also receives an input 76 from the bus line 72. The buffer 64 receives an input 78 from the outputs divider 62 and also receives a control input 80 from the bus line 72. The buffer 64 has an output Fout that represents a fixed frequency output of the frequency generator 10.

The function of the output block 14 is to receive the voltage controlled oscillator frequency Fvco from the PLL 34 and to manipulate the frequency Fvco in response to configuration information received from the configuration block 18. The output divider 62 can manipulate the voltage controlled oscillator frequency Fvco to a certain extent by dividing the frequency Fvco by certain predetermined constants. The outputs block 14 may respond to certain control information provided by the configuration block 18 which, once configured, may never change. For example, the output divider 62 can be set to divide the voltage controlled oscillator frequency Fvco by one of a predetermined set of constants. However, once this set of constants is established, it rarely changes. The output multiplexer 60 chooses between an input from the reference crystal oscillator 28 or an input Fvco from the PLL 34 and presents an output signal to the output divider 62. It should be appreciated that the information stored in the configuration block 18 could be combined with the information stored in the frequency control block 16.

The frequency control block 16 generally comprises a first buffer 82, a second buffer 84 and a frequency EPROM table 86. The first buffer 82 receives a first frequency select signal 88 from an external source. The second buffer 84 receives a second frequency select signal 90 from the same external source. Although FIG. 1 shows only two external frequency select signals 88 and 90, more than two frequency select signals can be used if greater flexability is desired for a particular design application. The number of frequency select signals 88 and 90 directly reflects the number of output frequencies available. Specifically, the number of output frequencies equals two to the I power, where I equals the number of frequencies select signals. In the case of two signals, two to the second power would equal four output frequencies available. Buffers 82 and 84 also receive a signal from the bus 72 which may adjust the input threshold of the buffers.

The configuration block 18 is comprised of an EPROM that controls various system configuration parameters that do not normally change once they are programmed. Such parameters include output multiplexer control, output divider control, output drive control and input threshold level. The configuration block 18 may be separated from the frequency control block 16 in an effort to save and optimize chip real estate. The configuration block 18 may not have any external inputs to vary the configuration once it is configured. Since these parameters are normally not altered after the initial configuration is established, this limitation is of little consequence. However, if a certain design criteria required the configuration block 18 to be externally controllable, external inputs could be provided at the expense of cost and chip size. Conversely, the frequency control block 16 contains configuration parameters that may be desirable to change after production of the clock generator 10. Frequency selection during normal operation is provided by external frequency select signals 88 and 90. The dividing of the configuration information between the frequency control block 16 and the configuration block 18 is only necessary to maximize efficiency and to provide a balance between cost and performance.

The clock generator 10 generally functions by receiving the first and second frequency select signals 88 and 90. These signals are used by the frequency EPROM table 86 to send information to the PLL 34. The PLL 34 sends the voltage controlled oscillator frequency Fvco to the output block 14. The output block 14 presents the output Fout by choosing, through the multiplexer 60, either the frequency Fvco or the first input signal 66.

Figure 2:
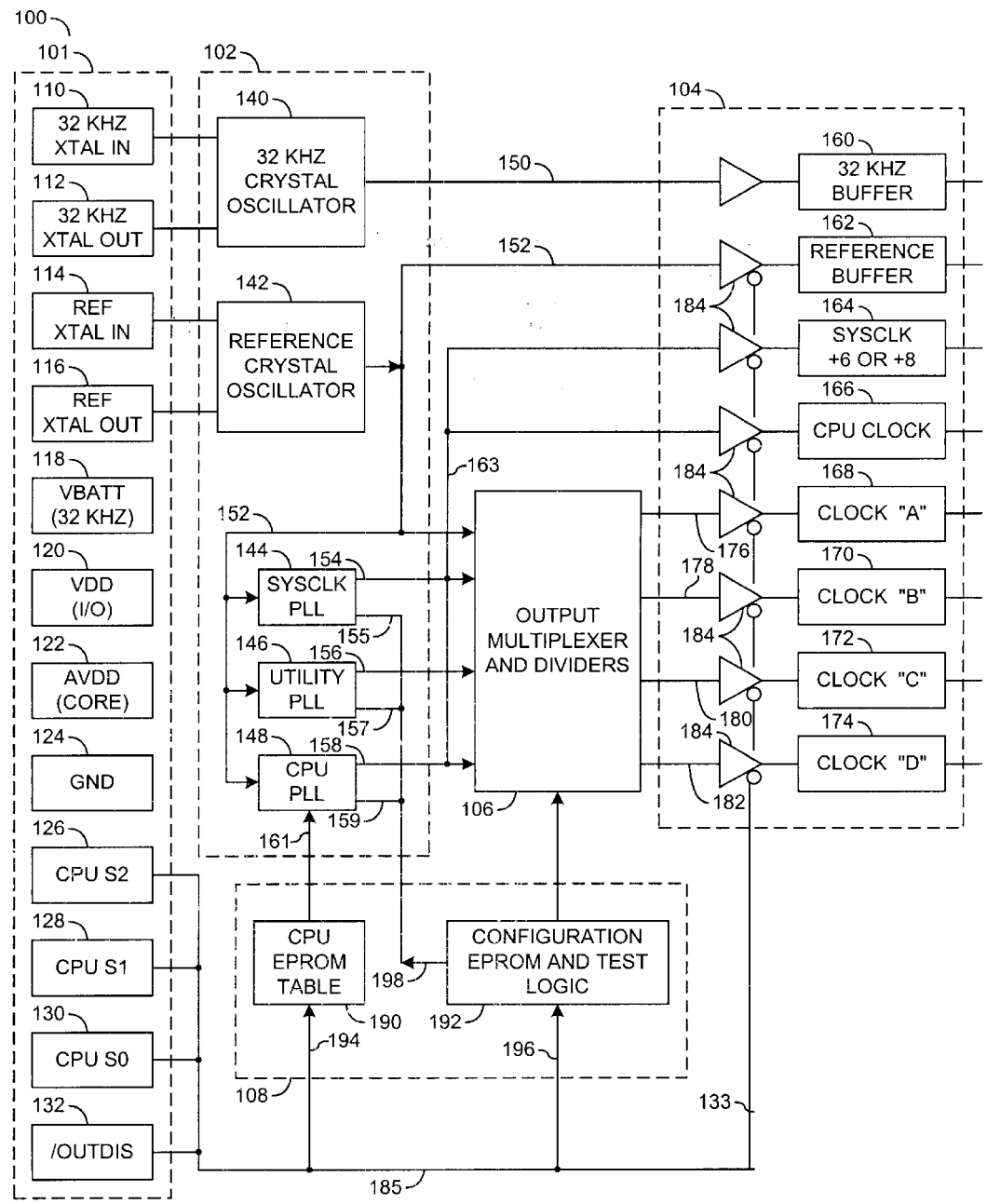
FIG. 2 is a block. diagram of the clock generator incorporating the architecture described in FIG. 1.

Referring to FIG. 2, a block diagram of a clock generator 100 having multiple phase-lock-loops 34 is shown. The clock generator 100 generally comprises an input section 101, a clock section 102, an output section 104, an output multiplexer and divider block 106 and an EPROM section 108. The input section 101 generally comprises various reference signals necessary to implement the clock generator 100. A pin 110 represents an input signal Xtal In, which is a 32 Khz reference signal. Similarly, a pin 112 represents an output signal Xtal Out, which is also a 32 Khz output signal. When a 32 Khz crystal is placed across the pin 110 and the pin 112, a 32 Khz signal is produced by block 140 from the resulting oscillator. A pin 114 represents an input signal Xtal In. A pin 116 represents an input signal Xtal Out. A pin 118 represents a battery signal Vbatt which powers a 32 Khz crystal oscillator. A pin 120 represents a power in signal Vdd (I/O) which powers the output pads. A pin 122 represents a signal Avdd which powers the chip core. A pin 124 represents a ground signal Gnd. A pin 126 represents a first input select signal S2. A pin 128 represents a second input select S1. A pin 130 represents a third input select signal S0. A pin 132 represents a signal Outdis which is used to enable and disable the clock generator 100 output signals. The input select signals S0, S1 and S2 are externally generated input signals that select a frequency at which the clock generator 100 will operate.

The clock section 102 generally comprises a 32 Khz crystal oscillator 140, a reference crystal oscillator 142, a system clock PLL 144, a utility PLL 146 and a CPU PLL 148. The reference crystal oscillator 142 provides a general circuit timing for the entire clock generator 100. The crystal oscillator 140 receives an input from the block 110 and presents an output 150 to the output section 104. The reference crystal oscillator 142 presents the reference signal to the output section 104 through an output line 152. The system clock PLL 144 receives an input from the reference crystal oscillator 142 through the output line 152. The system clock PLL 144 also receives signals from the configuration bus 198 through a signal bus 155. The system clock PLL 144 has an output 154 that is presented to the output multiplexer and divider block 106. The utility PLL 146 receives an input from the reference crystal oscillator 142 through the output line 152. The utility PLL 146 also receives a set of signals from the configuration EPROM bus 198 through a signal bus 157. The utility PLL 146 presents an output 156 to the output multiplexer and divider block 106. The CPU PLL 148 receives an input from the output 152 of the reference crystal oscillator 142. The CPU PLL 148 presents an output 158 to the output multiplexer and divider block 106. The CPU PLL 148 also receives configuration information from the EPROM section 108 on a bus line 159 and a bus line 161.

The output section 104 generally comprises a 32 Khz buffer output 160, a reference buffer output 162, a system clock output 164, a CPU clock output 166, a clock A output signal 168, a clock B output signal 170, a clock C output signal 172 and a clock D output signal 174. The 32 Khz buffer 160 receives an input through the output line 150 from the 32 Khz crystal oscillator 140. The reference buffer 162 receives an input from the reference crystal oscillator 142 through the output line 152. The system clock output 164 receives a signal 154 from the PLL 144 via the bus line 163. The system clock output 164 divides the output 154 from the system clock PLL 144 by a fixed predetermined value. The CPU clock output 166 also receives an input signal 158 from the PLL 148 via the bus line 163. The clock A signal 168 receives an input from an output 176 of the multiplexer and divider block 106. Similarly, the clock B signal 170 receives an input from an output 178 of the multiplexer and divider block 106. The clock C signal 172 receives an input from an output 180 from the output multiplexer and divider block 106. The clock D signal 174 receives an input from an output 182 of the multiplexer and divider block 106. The multiplexer and divider block 106 allows the clock A signal 168, the clock B signal 170, the clock C signal 172 and the clock D signal 174 to each be generated from either the system clock PLL 144, the utility PLL 146 or the CPU PLL 148. Prior to producing the output signals 168–174, the multiplexer and divider block 106 provides a 2 to the N divider function on each of the signals 168–174 where N is a variable controlled by the EPROM section 108.

Each of the output signals 162–174 has a switch 184 connected in series with the respective inputs. The switch 184 is controlled by a signal 133 which is controlled by the outdis pin 132. This allows,all outputs of the chip to be disabled for system test purposes.

The EPROM section 108 generally comprises a frequency EPROM 190 and configuration EPROM 192. The frequency EPROM 90 is similar to the frequency EPROM 86 of FIG. 1. The configuration EPROM 192 is similar to the configuration control block 18 of FIG. 1. The frequency EPROM 190 receives an input 194 from the bus 185. These signals are used for frequency selection during normal operation and for programming control during EPROM programming. The configuration EPROM 192 receives an input 196 from the bus 185 and has an output bus 198. Configuration information for the system clock PLL 144, utility PLL 146 and a portion of the CPU PLL 148 are distributed on the configuration signal bus 198. The EPROM section 108 uses the terminology "EPROM" to generally describe any non-volatile technology. The present invention applies to all non-volatile floating gate technologies, specifically EEPROM and Flash memory. RAM storage where the contents of the RAM are maintained for an extended period (more than 1 year) by an external battery source would also be within the scope contemplated by the present invention as well as any method of memory that is erasable and electrically programmable.

The clock generator 100 shown in FIG. 2 generally functions by receiving the select signals 126, 128 and 130 to provide information to the EPROM section 108. The EPROM section 108 then initializes the clock section 102 to produce various specific frequencies from the PLLs 144, 146 and 148. The output section manipulates these frequencies to present multiple outputs from block 104.

Figure 3A:
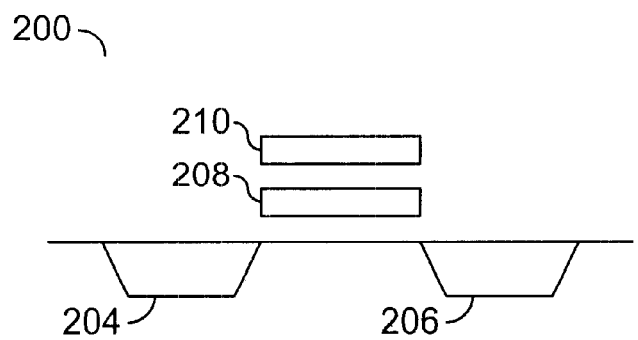
FIG. 3B is a diagram illustrating a single-poly EPROM cell in comparison to a conventional EPROM cell in FIG. 3A.

Referring to FIG. 3A, a conventional EPROM cell 200 is shown as compared to a single-poly EPROM cell 202. The conventional EPROM cell 200 generally comprises a source 204, a drain 206, a floating gate 208 and a select gate 210. The floating gate 208 is positioned between the source and drain 204 and 206 and the select gate 210.

Figure 3B:
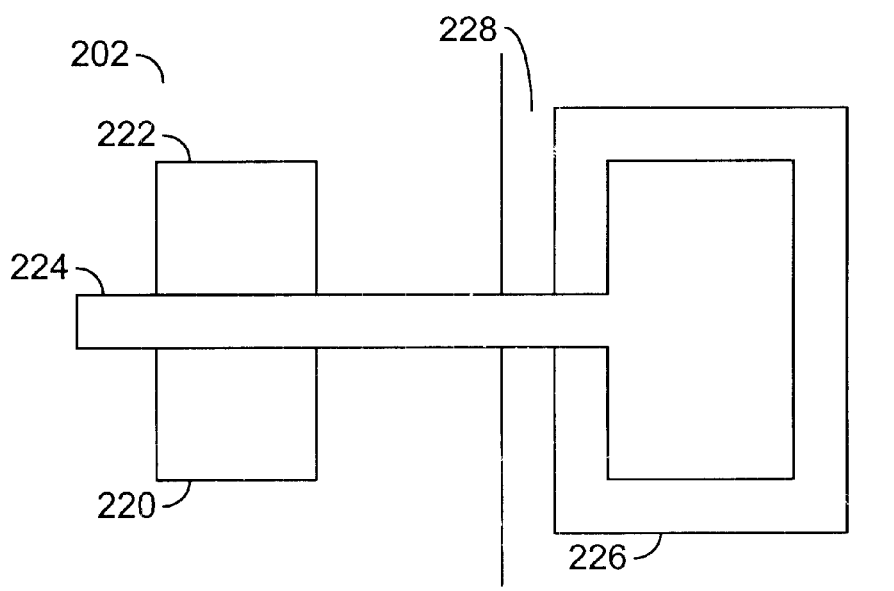

Referring to FIG. 3B, a single-poly EPROM cell 202 generally comprises a source 220, a drain 222, a floating gate 224, a tap/diffusion capacitor 226 and an N-Well select line 228. The tap/diffusion capacitor 226 couples with the floating gate 224. The single-poly EPROM cell 202 is also known as a planar EPROM. The single-poly EPROM cell 202 is less expensive to manufacture than the conventional EPROM cell 200 because far fewer manufacturing steps are involved due to the elimination of one layer of polysilicon. The disadvantage of the single-poly EPROM cell 202 is that it requires more silicon area to implement.

The implementation of the clock generator 10 requires only a few hundred bits of storage capacity, so the small additional cost caused by the area penalty imposed by the use of a single-poly EPROM cell 200 is preferable to the cost of the manufacturing steps required to implement a conventional stacked gate EPROM. The single-poly EPROM cell 202 requires high voltage circuits to be programmed. The single-poly EPROM is also slower than a stacked gate EPROM. However, this is not an important design criteria for the implementation of the clock generator 10. The single-poly EPROM cell 202 allows a reduced manufacturing process complexity, as well as a reduced cost which are both necessities in the highly competitive clock generator market. Therefore, the advantages of using a single-poly EPROM cell 202 outweigh the sacrifice in speed and chip space.

Another advantage or the clock generator 10 is the ability to implement field programming. This allows customers or distributors to stock inventory of clock generators 10 in an unprogrammed state. The unprogrammed clock generators 10 can then be configured by the end user as desired for a particular design. This reduces inventory costs for the end user as well as allows the end user to quickly configure prototype devices to meet their particular design criteria.

It is to be understood that modifications to the invention might occur to one with skill in the field of the invention within the scope of the appended claims.

What is claimed is:

1. A circuit for generating a clock signal comprising:
   a single-poly EPROM for storing configuration information to determine a frequency of oscillation of said clock signal; and
   a clock generator receiving said configuration information and generating said clock signal having said frequency of oscillation,
   wherein said single-poly EPROM and said clock generator are on a single chip.

2. The circuit according to claim 1, wherein said configuration information comprises frequency based information for determining the frequency at which the clock signal oscillates and general information for controlling one or more non-frequency parameters of the circuit.

3. The circuit according to claim 1, wherein said configuration information comprises frequency based information for determining the frequency at which the clock signal oscillates and general information for controlling two or more non-frequency parameters of the circuit.

4. The circuit according to claim 1, wherein said configuration information controls said frequency of oscillation and an output multiplexer.

5. The circuit according to claim 1, wherein said configuration information controls said frequency of oscillation and a parameter of said-clock generator.

6. The circuit according to claim 1, wherein said configuration information also controls an output divider.and an output multiplexer.

7. The circuit according to claim 1, wherein said configuration information also controls at least one of (i) an input threshold and (ii) an output drive control of said circuit.

8. The circuit according to claim 1, wherein said configuration information also controls an output divider circuit.

9. The circuit according to claim 1, wherein said clock generator comprises a phase-locked-loop (PLL).

10. The circuit according to claim 1, wherein said single-poly EPROM is programmable after said circuit is packaged.

11. The circuit according to claim 1, wherein said single-poly EPROM is programmable and erasable during a wafer sort step of a production process.

12. A circuit for generating a clock signal comprising:
    a single-poly EPROM for storing configuration information to determine a frequency of oscillation of said clock signal; and
    a clock generator receiving said configuration information and generating said clock signal having said frequency of oscillation,
    wherein said single-poly EPROM and said clock generator are on a single integrated circuit.

13. The circuit according to claim 12, wherein said configuration information comprises frequency based information for determining the frequency at which the clock signal oscillates and general information for controlling one or more non-frequency parameters of the circuit.

14. The circuit according to claim 12, wherein said configuration information comprises frequency based information for determining the frequency at which the clock signal oscillates and general information for controlling two or more non-frequency parameters of the circuit.

15. The circuit according to claim 13, wherein said configuration information controls said frequency of oscillation and an output multiplexer.

16. The circuit according to claim 13, wherein said configuration information controls said frequency of oscillation and a parameter of said clock generator.

17. The circuit according to claim 13, wherein said configuration information also controls an output divider and an output multiplexer.

18. The circuit according to claim 13, wherein said configuration information also controls at least one of (i) an input threshold and (ii) an output drive control of said circuit.

19. The circuit according to claim 13, wherein said configuration information also controls an output divider circuit.

20. The circuit according to claim 13, wherein said clock generator comprises a phase-locked-loop (PLL).

21. The circuit according to claim 13, wherein said single-poly EPROM is programmable after said circuit is packaged.

22. The circuit according to claim 13, wherein said single-poly EPROM is programmable and erasable during a wafer sort step of a production process.

23. A single integrated circuit for generating a plurality of clock output signals each having a frequency, said integrated circuit comprising:
    single-poly EPROM configured to store configuration information for determining the frequency of at least one of said plurality of clock signals and one or more non-frequency parameters of said circuit;
    a first clock generator having (i) a set of inputs to receive a frequency determining set of said configuration information and (ii) a reference input coupled to a reference output signal, wherein said first clock generator generates one of said plurality of clock output signals at one of said frequencies determined by said configuration information;
    a fixed frequency clock generator having a reference input coupled to said reference output signal, said fixed frequency clock generator having an output signal that oscillates at a fixed frequency; and
    a multiplexer having (i) a plurality of inputs configured to receive the outputs from said first clock generator and, said fixed frequency clock generator and (ii) a bus input connected to said single-poly EPROM, wherein said multiplexer selects between said outputs from said first clock generator and said fixed frequency clock generator as at least one of said clock output signals in response to one or more bits of the configuration information.

24. The circuit according to claim 23, wherein said first clock generator comprises a phase locked loop and said reference output signal is generated by a crystal oscillator.

25. The circuit according to claim 24, further comprising a second phase locked loop configured to generate another of said plurality of clock output signals.

26. The circuit according to claim 25, further comprising a third phase locked loop configured to generate another of said plurality of clock output signals.

27. The circuit according to claim 24, further comprising a plurality of phase locked loops, each configured to generate one of said plurality of clock output signals.

28. A method for generating a plurality of clock signals comprising the steps of:
  (A) storing information in a single-poly EPROM for generating one or more first clock signals having one or more of a plurality of programmable frequencies;
  (B) generating a second clock signal having a frequency determined by a crystal or an input having a fixed frequency;
  (C) selecting a portion of said information stored in said single-poly EPROM for generating said one or more first clock signals in response to a select input; and
  (D) generating said one or more first clock signals in response to said second clock signal and said portion of said information.

29. The method according to claim 28, further comprising the step of:
  selecting either one of said first clock signals or said second clock signal to generate one or more third clock signals in response to said information contained in said single-poly EPROM.

30. The method according to claim 29, further comprising the step of:
  dividing at least one of said one or more first clock signals or third clock signals in response to said information contained in said single-poly EPROM.

31. The method according to claim 28, wherein said information includes configuration information for configuring non-frequency parameters, said method further comprising the step of:
  configuring two or more non-frequency parameters in response to said configuration information.

32. The method according to claim 28, wherein step (A) includes storing configuration information for controlling one or more non-frequency parameters.

33. The method according to claim 32, further comprising the step of:
  adjusting one or more operating parameters in response to said configuration information for controlling non-frequency parameters, wherein said one or more operating parameters comprise one or more members of the group consisting of a parameter of a clock generator, an output multiplexer, an output divider, an input threshold level, and an output drive level.

34. A method for generating a plurality of clock signals comprising the steps of:
  (A) storing configuration information in a singlepoly EPROM for generating one or more first clock signals having one or more of a plurality of programmable frequencies;
  (B) generating a second clock signal having a frequency determined by a crystal or an input having a fixed frequency; and
  (C) generating said one or more first clock signals. in response to frequency-determining and non-frequency. configuration information.

35. The method according to claim 34, further comprising the step of:
  configuring two or more non-frequency parameters in response to said non-frequency configuration information.

* * * * *